United States Patent [19]
Farmer, Jr.

[11] 4,101,823
[45] Jul. 18, 1978

[54] METHOD AND APPARATUS FOR MEASURING CATHODE EMISSION SLUMP

[75] Inventor: Felta Carl Farmer, Jr., Marion, Ind.

[73] Assignee: RCA Corporation, New York, N.Y.

[21] Appl. No.: 781,877

[22] Filed: Mar. 28, 1977

[51] Int. Cl.² .................................... G01R 31/024
[52] U.S. Cl. .......................... 324/20 CR; 324/20 R
[58] Field of Search .............. 324/20 R, 20 CR, 23, 324/26, 27; 358/10; 316/27; 178/DIG. 37

[56] References Cited
U.S. PATENT DOCUMENTS 3,878,455  4/1975  Ochmann .................. 324/20 CR

OTHER PUBLICATIONS

William Kelvin, Modern Picture-Tube Testers, Radio-Electronics, vol. 12, Dec. 1960, pp. 59-62.

*Primary Examiner*—M. Tokar
*Attorney, Agent, or Firm*—Eugene M. Whitacre; Glenn H. Bruestle; Dennis H. Irlbeck

[57] ABSTRACT

A cathode ray tube having a cathode and first, second and third grid electrodes, is biased "on" to allow an electron current $I_K$ to flow from the cathode to the second and third grid electrodes. During a test period of predetermined length, the peak value of cathode current is stored as a reference measurement $I_{kp}$ and the cathode current $I_k$ is continuously monitored and compared with $I_{kp}$. A failure indication is provided if the magnitude of $I_{kp} - I_k$ exceeds a predetermined value at any time during the test period.

7 Claims, 4 Drawing Figures

METHOD AND APPARATUS FOR MEASURING CATHODE EMISSION SLUMP

BACKGROUND OF THE INVENTION

This invention relates to methods and apparatus for measuring cathode emissions of vacuum tubes and more particularly for measuring cathode emission slump in cathode ray tubes.

Apparatus for measuring cathode emission is not new. For example, an apparatus for measuring nominal emission currents of x-ray tubes is disclosed in U.S. Pat. No. 3,878,455 issued to Ochmann. Also, an apparatus for measuring peak emission of cathodes in color television picture tubes is disclosed in U.S. Pat. No. 3,654,548 issued to Pecorari et al. Further, an apparatus for measuring the beam current component of cathode emission in television picture tubes is disclosed in U.S. Pat. No. 2,732,526 issued to Futterman.

Although the above-referenced apparatus are useful in measuring cathode emission at a particular point in time, it has been found that cathode emission will most likely vary as a function of time. It has been further determined that an important parameter in determining future picture tube performance is cathode emission slump which is defined as a decrease in the magnitude of cathode emission over a period of time.

It can be empirically determined that if the difference between the peak emission current and the lowest value of emission current measured during a predetermined time period is greater than a predetermined magnitude, the tube will be susceptible to premature cathode failures. Consequently, in the mass production of quality television picture tubes, it is highly desirable that the emission slump test be automatically performed on every tube in order to cull out the potentially weak performers.

SUMMARY OF THE INVENTION

A method of measuring cathode emission slump which comprises the steps of comparing peak emission current $I_{kp}$ with cathode emission current $I_k$ during a predetermined test period. A rejection indication is provided if the magnitude of $I_k$ is less than the magnitude of $I_{kp}$ by a predetermined percentage at any time during the test period.

DETAILED DESCRIPTION

Figure 1:
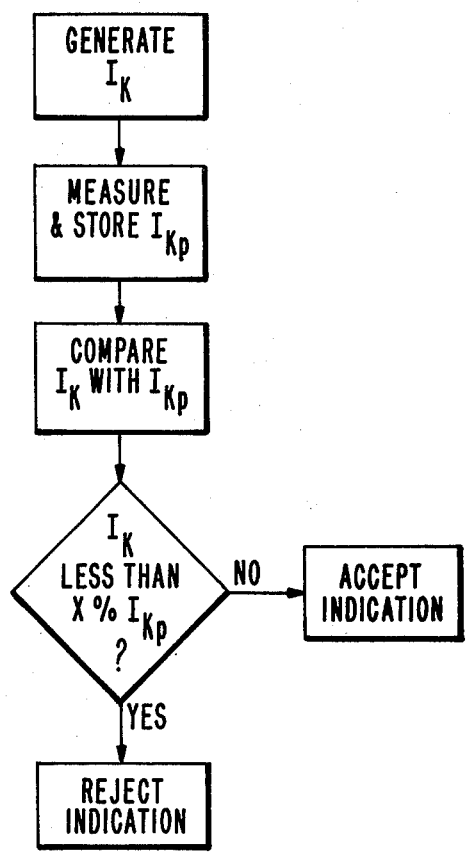
FIG. 1 is a block diagram depicting the steps of the method of the present invention.

Referring to FIG. 1 there is shown a block diagram depicting the steps of the method of the present invention. The first step entails the generation of a predetermined cathode emission current $I_k$. When the vacuum tube under test is a color television picture tube, for example an RCA type 19VGQTC01, the desired magnitude of cathode current from each cathode is in the range of 3-5 milliamps. In the preferred embodiment of the apparatus of the present invention, this cathode current is generated as follows. The cathode is first preheated by applying a voltage to the cathode filament as is well known in the art. The cathode is electrically connected to the $G_1$ grid and both are electrically connected to ground. The $G_2$ grid is electrically connected to the $G_3$ grid and both are connected to a source of AC voltage. The AC voltage source is adjusted to provide a voltage in the range of 200-285 volts rms. It should be noted here that a DC voltage applied to the $G_2$ and $G_3$ or to the $G_2$ alone will be equally effective in generating a desired amount of $I_k$.

After the desired magnitude of $I_k$ has been generated, the peak value, $I_{kp}$, of $I_k$ is measured and stored and is continuously compared with $I_k$ during the test period. The duration of this test period, in the preferred embodiment, is substantially equal to five seconds. This period was established considering the time constraints imposed by production line testing. It should be noted that where time permits, the test period can and should be extended as much as possible. The longer the test period, the better the chance of detecting emission slump.

If $I_k$ becomes less than a predetermined percentage of $I_{kp}$ at any time during the test period, a reject indication will occur. If $I_k$ does not become less than the predetermined percentage of $I_{kp}$, an accept indication will occur at the conclusion of a test period. In the preferred embodiment, with a tube under test of the type stated above, the reject indication will occur if the value of $I_k$ falls below 90% of the value of $I_{kp}$.

Figure 2:
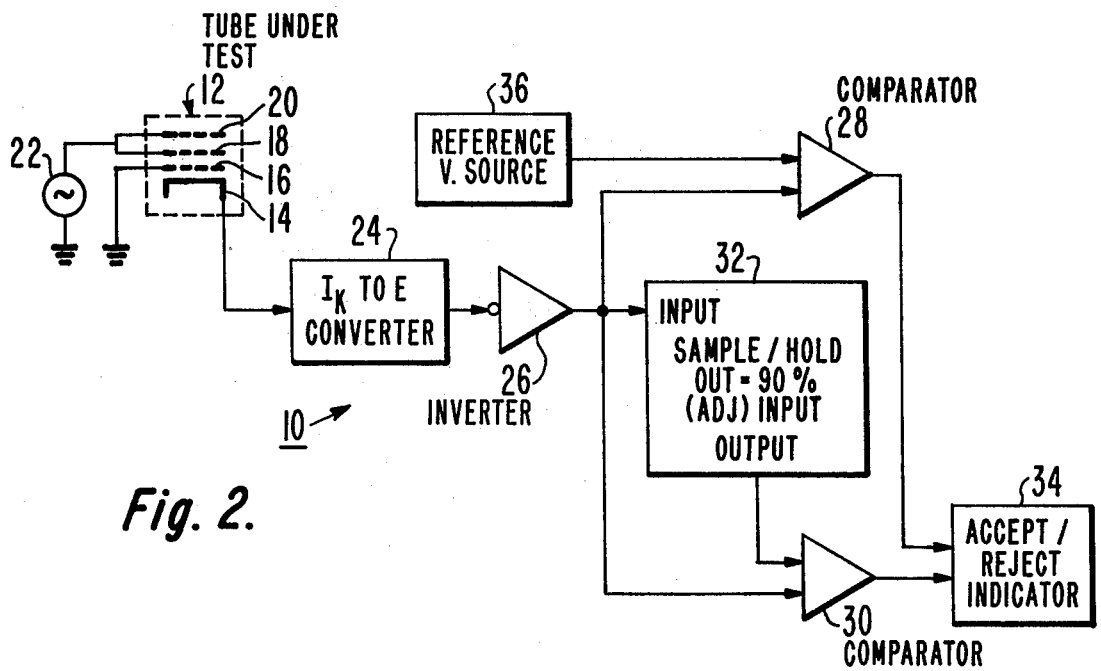
FIG. 2 is a functional block diagram of the apparatus of the present invention.

Referring to FIG. 2, there is shown a functional block diagram of the apparatus 10 for measuring cathode emission slump in accordance with the present invention. A tube under test 12, having a cathode 14, a G1 grid 16, a G2 grid 18 and a G3 grid 20, is electrically connected to the apparatus 10 as follows. The G2 grid 18 and G3 grid 20 are electrically connected together and to the output of an AC voltage supply 22. The G1 grid 16 is electrically connected to ground. The cathode 14 is electrically connected to the input of a current-to-voltage converter 24. The output of the current-to-voltage converter 24 is electrically connected to the input of an inverter 26.

The output of the inverter 26 is electrically connected to one input of a first two-input comparator 28, one input of a second two-input comparator 30 and an input of a sample and hold circuit 32. An output of the sample and hold circuit 32 is electrically connected to the other input of the second comparator 30. The output of the second comparator 30 is electrically connected to an accept-reject indicator circuit 34. A reference voltage source 36 is electrically connected to the other input of the first comparator 28. The output of the first comparator 28 is electrically connected to the accept/reject indicator circuit 34.

The apparatus 10 operates as follows. A voltage is applied to the filament (not shown) of the tube under test 12 in order to heat the cathode 14. The AC voltage supply 22 provides an output voltage substantially equal to 280 volts rms, in order to produce current flow from the cathode 14 to the G2/G3 grid circuits. The cathode current $I_k$ is present at the input of the current-to-voltage converter 24. The output of the current-to-voltage converter 24 is a voltage which is proportional to the magnitude of the cathode current $I_k$.

Figure 3:
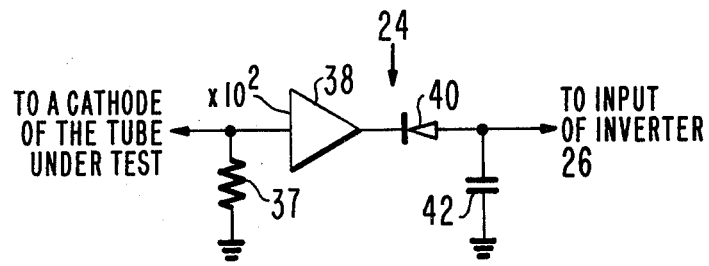
FIG. 3 is a schematic diagram of a current to voltage converter of the apparatus of the present invention.

FIG. 3 is a schematic diagram of the current-to-voltage converter 24, which comprises a first resistor 37 electrically connected between an input of an operational amplifier 38 and ground. The operational amplifier 38 is, for example, one-half of a National Semiconductor Corporation type LM747 "Dual Operational Amplifier", electrically connected to produce a gain of 100. The output of the operational amplifier 38 is electrically connected to the cathode of a diode 40, for example, a 1N55A. A capacitor 42 is electrically connected between the anode of the diode 40 and ground. The AC voltage drop across the first resistor 37, which is proportional to the cathode current $I_k$, is amplified by the operational amplifier 38 and rectified by the diode 40. The capacitor 42 filters the rectified voltage before it is applied to the input of the inverter 26.

The inverter 26 inverts the rectified voltage in order to provide a signal acceptable at the inputs of the first comparator 28, the second comparator 30 and the sample/ hold circuit 32. The output from the inverter 26 is a voltage which is substantially equal to, but of different polarity than, the output voltage from the current-to-voltage converter 24 and is therefore proportional to the magnitude of the cathode current $I_k$.

This converter output voltage is compared with the output of the reference voltage source 36 by the first comparator 28. If the output voltage from the inverter 26 is less than the voltage from the reference source 36, the first comparator 28 will apply a fail signal to the accept/reject indicator circuit 34. This fail signal causes an indication signifying that the cathode current has not exceeded a minimum acceptable level, the magnitude of which is predetermined by adjusting the output of the reference voltage source 36. If the output voltage from the inverter exceeds the reference voltage source 36, the first comparator 28 will not output the fail signal, signifying that the cathode current $I_k$ has exceeded the minimum acceptable magnitude.

The accept/reject indicator 34 comprises, for example, a set/reset flip flop, the output of which is connected to an indicator lamp through a lamp driver. The set input is electrically connected to the output of the first comparator 28. The reset input is connected to a convenient form of pulse generator which generates a reset pulse at the conclusion of the test period.

Figure 4:
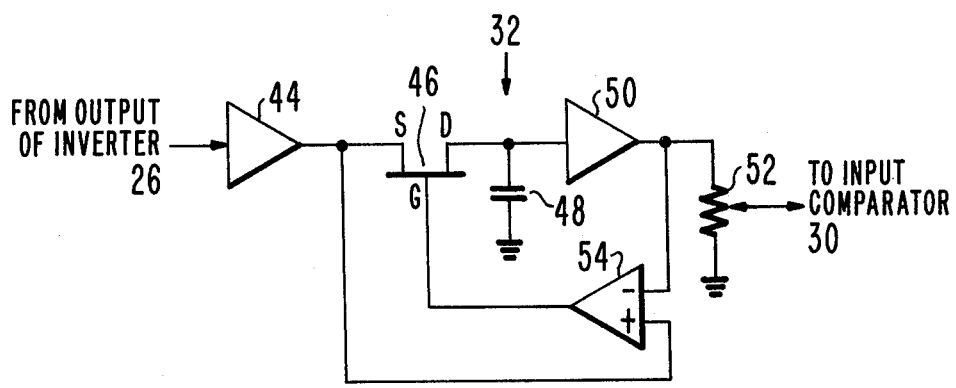
FIG. 4 is a schematic diagram of a sample/hold circuit of the apparatus of the present invention.

The output voltage from the inverter 26 is monitored by the sample/hold circuit 32. As shown in FIG. 4, the sample/hold circuit 32 includes a first amplifier 44, a field effect transistor 46, a capacitor 48, a second amplifier 50, a potentiometer 52, and an operational amplifier 54. The first and second amplifiers, 44 and 50, and the operational amplifier 54 are, for example, National Semiconductor Corp. type LM207 "Operational Amplifiers." The field effect transistor 46 is, for example, a type 2N4393. The capacitor, in the preferred embodiment, has a value of 50 microfarads at 50 volts and the potentiometer is a 20 turn potentiometer having a value of 50 K ohms.

The input of the first amplifier 44 is electrically connected to the output of the inverter 26. The output of the first amplifier 44 is electrically connected to the source electrode of the field effect transistor 46 and the positive input of the operational amplifier 54. The drain electrode of the field effect transistor 46 is electrically connected to one terminal of the capacitor 48 and the input of the second amplifier 50. The other terminal of the capacitor 48 is electrically connected to ground. The output of the second amplifier 50 is electrically connected to the negative input of the operational amplifier 54 and one terminal of the potentiometer 52. The other terminal of the potentiometer 52 is electrically connected to ground. The wiper of the potentiometer 52 is electrically connected to the input of the comparator 30. The output of the operational amplifier 54 is electrically connected to the gate of the field effect transistor 46.

The sample/hold circuit 32 operates as follows. The output from the inverter 36 is applied to the input of the first amplifier 44. This amplifier has unity voltage gain, providing a relatively high output current at low impedance for rapidly charging the capacitor 48. The field effect transistor 46 functions as a switch, permitting charging current to be applied to the capacitor 48 when the voltage applied to the gate electrode is greater than zero. When this voltage is less than zero, the field effect transistor 46 turns off preventing the capacitor from charging further. When the field effect transistor 46 is off, it presents a high impedance path to the capacitor 48. Since the input of the second amplifier 50 also presents a high impedance path to the capacitor, the leakage rate of the charge stored thereon will be small. The voltage thus present across the capacitor will be applied to the input of the second amplifier 50.

The voltage output from the second amplifier 50 is substantially equal to the input voltage and is applied to the negative input of the operational amplifier 54. The output from the first amplifier 44 is applied to the positive input of the operational amplifier 54. Thus, it can be seen that as long as the output from the first amplifier 44 exceeds the output from the second amplifier 50, the output from the operational amplifier 54 will be greater than zero, causing the field effect transistor 46 to remain on and the capacitor 48 to charge. When the output of the second amplifier 50 exceeds that of the first amplifier 44, the output of the operational amplifier 54 will become less than zero, turning the field effect transistor 46 off. The capacitor will cease charging and the resulting voltage across the capacitor will be the peak voltage output from the inverter 26.

This peak voltage is applied to the potentiometer 52 through the second amplifier 50. The potentiometer 52 is adjusted to output a desired percentage of the peak voltage. In the preferred embodiment, this desired percentage is equal to 90% of the detected peak. The voltage equivalent of this desired percentage is applied to one input of the second comparator 30 as shown in FIG. 2 and compared against the output of the inverter 26 throughout the specified test period. In the preferred embodiment, this test period is approximately equal to 5 seconds. If the output of the inverter 26 becomes less than the output of the sample/hold circuit 32, the second comparator will output a fail signal to the accept-/reject indicator 34. This is an indication that the cathode current $I_k$ has slumped beneath 90% of the peak cathode current $I_{kp}$. If the output of the inverter 26 does not become less than the output of the sample/hold circuit 32, the comparator 30 will not output a reject signal thereby signifying that the cathode current has remained equal to or greater than the peak cathode current during the specified test period.

I claim:

1. A method of measuring an electron emission slump of a cathode in a vacuum tube, wherein said vacuum tube is a cathode ray tube having at least one cathode, one control grid G1 and one screen grid G2 said method comprising the steps of:
    (a) heating said cathode;
    (b) applying ground potential to said cathode and G1 grid;
    (c) applying a positive potential, $E_{G2}$ to said G2 grid;

(d) increasing the magnitude of $E_{G2}$ until a predetermined value of $I_k$ is obtained;

(e) measuring a peak value, $I_{kp}$, of the cathode emission current $I_k$ which is generated during a predetermined test period;

(f) comparing the magnitude of $I_k$ with $I_{kp}$ during said test period; and (g) providing a failure indication if the magnitude of $I_k$ becomes less than a predetermined percentage of $I_{kp}$.

2. A method of measuring an electron emission slump of a cathode in a vacuum tube comprising the steps of:

(a) measuring a peak value, $I_{kp}$, of a cathode emission current $I_k$ which is generated during a predetermined test period by the following steps:

i. converting $I_k$ to a voltage $V_k$, the magnitude of which is proportional to the value of $I_k$; and ii. applying $V_k$ to a peak detecting sample and hold means for producing a steady state output voltage $V_{kp}$ which is proportional to $I_{kp}$;

(b) comparing the magnitude of $I_k$ with $I_{kp}$ during said test period; and (c) providing a failure indication if the magnitude of $I_k$ becomes less than a predetermined percentage of $I_{kp}$.

3. A method of measuring an electron emission slump of a cathode in a vacuum tube comprising the steps of:

(a) measuring a peak value, $I_{kp}$, of a cathode emission current $I_k$ which is generated during a predetermined test period;

(b) comparing the magnitude of $I_k$ with $I_{kp}$ during said test period by the following steps:

i. providing a potentiometer having a pair of end terminals and a wiper contact which is adjustable to make sliding contact therebetween;

ii. applying $V_{kp}$ to one of said end terminals and ground potential to the other end terminal;

iii. adjusting said potentiometer to produce a voltage $V_{kw}$ at said wiper contact which is equal to said predetermined percentage of $V_{kp}$; and iv. applying $V_{kw}$ to one input of a two-input voltage comparator; and (c) providing a failure indication if the magnitude of $I_k$ becomes less than a predetermined percentage of $I_{kp}$.

4. A method in accordance with claim 3 wherein step (c) comprises:

i. applying $V_k$ to the other input of said two-input voltage comparator;

ii. providing a signal $V_{ko}$ when $V_k$ is less than $V_{kw}$;

iii. applying $V_{ko}$ to a set input of a set/reset flip flop; and iv. applying a set output of said flip flop to a fail indicator.

5. An apparatus for measuring electron emission slump of a cathode in a vacuum tube comprising:

(a) means for measuring a peak value, $I_{kp}$, of a cathode emission current $I_k$ which occurs during a predetermined test period, including:

i. a current to voltage converter having an input which is adapted to be electrically connected to said cathode, and an output; and ii. a peak detecting sample and hold means having an input which is electrically connected to the output of said current to voltage converter and an output,;

(b) means for comparing the magnitude of $I_k$ with $I_{kp}$ during said test period; and (c) means for providing a failure indication if the magnitude of $I_k$ becomes less than a predetermined percentage of $I_{kp}$.

6. An apparatus in accordance with claim 5 wherein said magnitude comparing means comprises:

(a) a potentiometer having a pair of end terminals and a wiper contact, one of said end terminals being electrically connected to the output of said peak detecting sample and hold means; and (b) a two input voltage comparator having an output which is proportional to the difference between the magnitudes of voltages applied to the two inputs, one of said inputs being electrically connected to the wiper contact of said potentiometer and the other input being electrically connected to the output of said current to voltage converter.

7. An apparatus in accordance with claim 6 wherein said means for providing an indication if $I_{ks}$ becomes less than a predetermined percentage of $I_{kp}$ comprises:

(a) a flip-flop having a set input and a reset input and a set output, the set input of which is electrically connected to the output of said voltage comparator; and (b) an indicator light which is illuminated in response to an occurrence of a signal from the set output of said flip-flop.

* * * * *